United States Patent [19]

Staffe

[11] Patent Number: 4,926,352
[45] Date of Patent: May 15, 1990

[54] DIAGNOSTIC SYSTEM FOR CONTROL APPARATUS OF A MOTOR VEHICLE

[75] Inventor: Detlef Staffe, Vaihingen, Fed. Rep. of Germany

[73] Assignee: Dr. Ing. h.c.F. Porsche Aktiengesellschaft, Stuttgart, Fed. Rep. of Germany

[21] Appl. No.: 229,474

[22] Filed: Aug. 8, 1988

[30] Foreign Application Priority Data

Aug. 7, 1987 [DE] Fed. Rep. of Germany ....... 3726344

[51] Int. Cl.⁵ ............... G01M 15/00; G01M 17/00; G06F 15/20
[52] U.S. Cl. ............................ 364/550; 73/117.3; 340/462; 364/431.01
[58] Field of Search ............... 364/431.01, 551.01, 364/424.03, 424.04; 73/116, 117.3, 119 R, 117.2; 371/20; 340/52 R

[56] References Cited

U.S. PATENT DOCUMENTS

| | | |
|---|---|---|
| 4,267,569 | 5/1981 | Baumann et al. |
| 4,317,364 | 3/1982 | Asano et al. .................. 73/117.3 |
| 4,395,624 | 7/1983 | Wartski ....................... 364/424.03 |
| 4,497,057 | 1/1985 | Kato et al. .................... 371/16 |
| 4,534,214 | 8/1985 | Takahashi ..................... 73/117.3 |
| 4,564,942 | 1/1986 | Horiuchi ...................... 371/20 |
| 4,601,193 | 7/1986 | Blauhut et al. ................ 73/35 |
| 4,694,408 | 9/1987 | Zaleski . |
| 4,703,258 | 10/1987 | Palesch ....................... 324/73 R |
| 4,748,843 | 6/1988 | Schäfer et al. ................ 73/117.3 |

FOREIGN PATENT DOCUMENTS

3432430 3/1986 Fed. Rep. of Germany.

OTHER PUBLICATIONS

Gil Bassak, "Microelectronics Takes to the Road in a Big Way: A Special Report", pp. 113-122 (Electronics/Nov. 20, 1988).

*Primary Examiner*—Felix D. Gruber
*Attorney, Agent, or Firm*—Evenson, Wands, Edwards, Lenahan & McKeown

[57] ABSTRACT

A diagnostic system for control apparatus of a motor vehicle equipped with self-diagnostic functions in which the control apparatus are connected with each other by way of a diagnostic bus and a defect lamp line. Diagnostic functions can be initiated by way of a key or momentary switch in an initialization line of the diagnostic bus whereby the diagnostic results can be read out at a defect lamp connected to the defect lamp line by way of flashing code word. The defect output thereby takes place strictly sequentially, defect-by-defect and control apparatus by control apparatus. In order to be able to discontinue at any time a diagnostic analysis of the control apparatus and to be able to continue to the diagnostic analysis of the next control apparatus, a newly defined special signal emission is applied to the initialization line. By an association of a certain information content to certain places of the flashing code and by a new testing apparatus, the diagnostic analysis, the defect recognition and the coordination of the defects to predetermined control apparatus is considerably facilitated and improved.

16 Claims, 4 Drawing Sheets

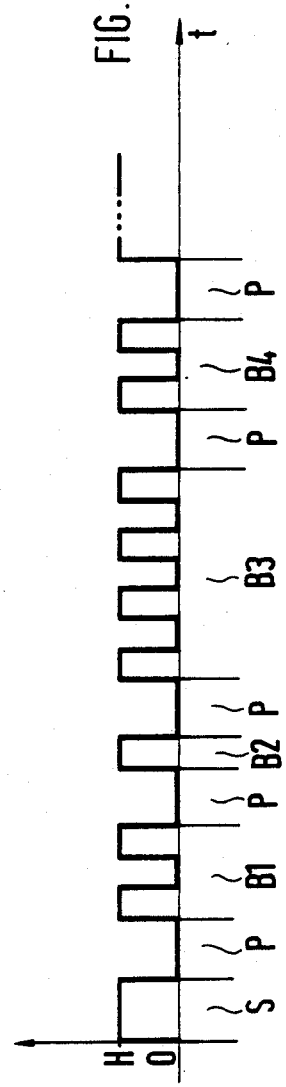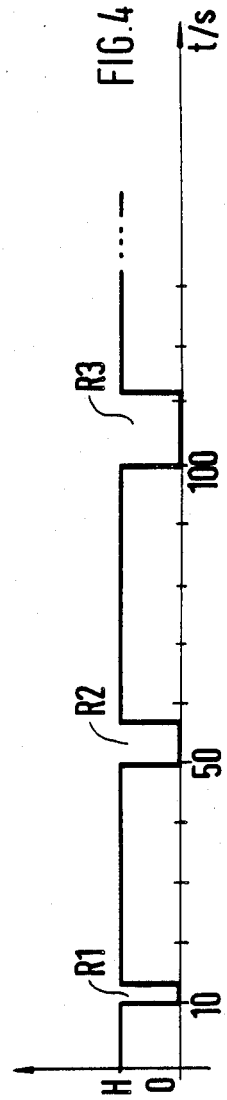

DIAGNOSTIC SYSTEM FOR CONTROL APPARATUS OF A MOTOR VEHICLE

BACKGROUND AND SUMMARY OF THE INVENTION

The present invention relates to a diagnostic system for at least two control apparatus of a motor vehicle equipped with a defect or trouble memory and at least one self-diagnostic function, whereby the control apparatus are connected with each other by way of a defect or trouble lamp line connected to a defect or trouble lamp and of a diagnostic bus consisting of at least one initialization line, and whereby the diagnostic functions, respectively, a read-out of the defect memory by application of signal defined by their time duration (initialization time) on the initialization line are initiated at different switching conditions of an ignition switch and informations concerning the condition of the control apparatus and/or its peripherals can be indicated by way of the defect or trouble lamp in the form of a flashing code which can be detected and counted by the human eye.

By reason of the constantly increasing function volume and of the ever-increasing number of electronic control apparatus in motor vehicles, diagnostic systems equipped with defect or trouble memories and self-diagnostic functions are increasingly used for the same. The control apparatus are thereby generally connected with each other by way of a diagnostic bus with which an external test apparatus or a test apparatus of the vehicle itself is adapted to be connected.

In addition to large and expensive service shop-test apparatus by means of which a fully automatic diagnostic analysis with defect or trouble output in plain language alpha-numerical) is possible, also the very simple and cost-favorable diagnostic systems with flashing code output come into utilization with an ever-increasing extent; smaller service shops and repair shops can also afford to purchase these simple diagnostic systems.

For example, the fuel injection control apparatus LH-Jetronic LH 2.3, the ignition control apparatus EZ 121K and the engine control apparatus Motronic M 2.1 of the company Bosch (see, for example, SAE Paper 840 541) which are capable of self-diagnostic analysis, are equipped with such a diagnostic system. These control apparatus are connected with each other in the motor vehicles by way of an initialization line (test line) and a defect (trouble) lamp line. A key or momentary switch is connected with the test line by way of a plug-in connection, by means of which the test line can be momentarily connected to ground. A defect lamp (light diode) is either arranged in the instrument panel of the motor vehicle or is structurally combined with the momentary switch in a common housing.

A diagnostic analysis of the aforementioned control apparatus and also of further control apparatus capable of self-diagnostic analysis (insofar as they are equipped therefor), for example, of a charging pressure regulation, of an anti-lock system, of an air-conditioning system, etc., is now possible by means of such a simple control apparatus, i.e., the defect memories arranged in these control apparatus can be read out by the test apparatus; the defects which during the operation of the control apparatus have occurred in the control apparatus itself or at its peripheral, are stored in the defect memory. Similarly, for example, a diagnostic analysis of the adjusting members actuated by the control apparatus is possible, as well as a so-called "basic air-requirement adaptation" in the idling speed (adjustment of the idling desired rotational speed).

The diagnostic sequence will now be explained by reference to the example of the read-out of the defect memory and is realized as follows:

After plugging in the test apparatus in the initialization (test) line and the defect (trouble) lamp line, the ignition switch is displaced into its position "ignition on" and the initialization line is connected to ground by means of the momentary switch for 2.5 to 5 seconds initialization time). The control apparatus with highest priority then commences with the read-out of the first defect or trouble by way of the defect or trouble lamp line in the form of a flashing code detectable and readable by the human eye, whereby a serviceman counts the number of flashing pulses and has to coordinate the same to four different digits or places of a code word (with a maximum of 9 flashing pulses per digit or place). He then compares the thus-obtained code word with a table in which certain troubles or defects in certain control apparatus or the peripherals thereof are coordinated to the individual trouble code words.

After the serviceman has detected the trouble or defect code and has noted the same, he can read-out the next trouble or defect by a renewed initialization of the control apparatus initialization time 2.5 to 5 seconds by the momentary switch until at the end of a code appears, "no further defects present". He can then erase the defect memory of the control apparatus by application of a signal of an initialization period in excess of ten seconds and continue in the same manner with the read-out of the trouble or defect memory of the control apparatus with the next lower priority until he has read-out finally all trouble or defect memories of all control apparatus.

In a similar manner, also the adjusting member—and switching input-diagnostic analysis and the base air requirement adaptation are carried out, in which the flashing code represents, for example, an address of an activated adjusting member. The read-out of the trouble or defect takes place, however, strictly sequentially, control apparatus by control apparatus with decreasing priority and defect for defect so that, for example, a direct access to a certain control apparatus is not possible. If, for example, it is known that a trouble or defect has occurred in the air-conditioning system of the motor vehicle, then nonetheless at first all control apparatus with higher priority have to be diagnostically analyzed even though this in not necessary or not even interesting under certain circumstances.

Similarly, with this diagnostic system, a direct relation of the read-out trouble or defect to a certain control apparatus is only possible with great difficulty because the flashing code indicates only generally a trouble or defect. As a result thereof, the trouble or defect coordination and identification is rendered unnecessarily difficult, for example, when during the diagnostic sequence the serviceman has forgotten which control apparatus is being diagnostically analyzed by him at that time.

It is therefore the object of the present invention to improve the diagnostic system as regards the diagnostic sequence and the trouble or defect identification in that the diagnostic sequence is accelerated and rendered more comfortable and the error or trouble identification and coordination is facilitated.

The underlying problems are solved according to the present invention in that a diagnostic function of a control apparatus or device can be interrupted at any time and/or a next control apparatus with lower priority can be selected at any time by application of an additional signal on the initialization line by the momentary switch of defined duration and in that a predetermined information content is coordinated to the four flashing sequences or digits of the flashing code word in their timed sequence.

The advantages of the present invention reside above all in the accelerated and more comfortably constituted sequence of the diagnostic functions and of the improved trouble or defect identification as well as in the improved coordination of the code words to certain control apparatus. Further advantages are to be seen in the creation of a simple testing apparatus which counts flashing sequences of flashing codes, indicates the code in clear text or plain language and can apply on the initialization line signals of preselected defined duration on momentary switch depression.

BRIEF DESCRIPTION OF THE DRAWINGS

These and other objects, features and advantages of the present invention will become more apparent from the following description when taken in connection with the accompanying drawing which shows, for purposes of illustration only, one embodiment in accordance with the present invention, and wherein.

FIG. 3 is a time diagram of a flashing code word as used in the present invention;

FIG. 4 is a time diagram of three defined signals on an initialization line as used in accordance with the present invention.

DETAILED DESCRIPTION OF THE DRAWINGS

Figure 1:
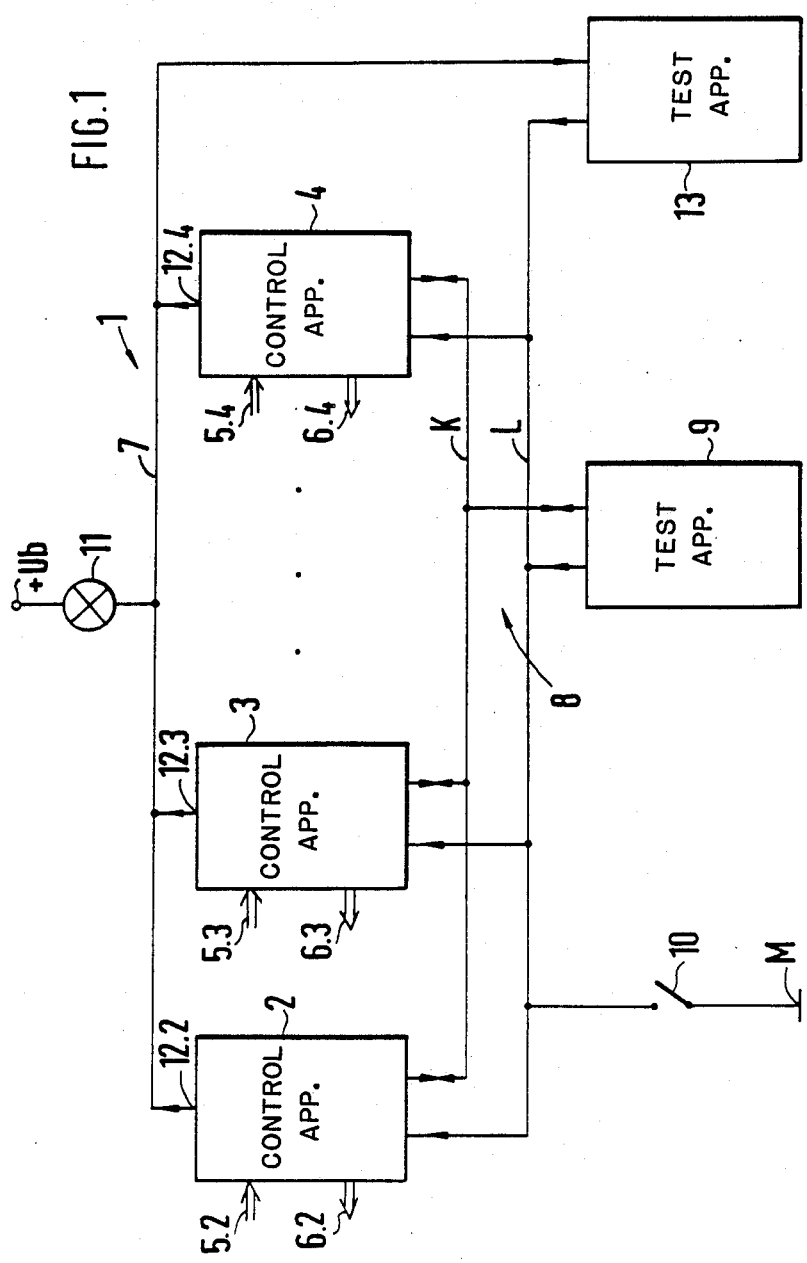
FIG. 1 is a schematic block diagram of a diagnostic system in accordance with the present invention having several control apparatus installed in a motor vehicle.

Referring now to the drawing wherein like reference numerals are used throughout the various views to designate like parts, a diagnostic system designated by reference numeral 1 with control apparatus or devices 2, 3 and 4 is illustrated in FIG. 1 which is installed into a motor vehicle. The control apparatus 2 to 4 are connected to sensors and switches by way of inputs 5.2–5.4 and to adjusting members by way of outputs 6.2 to 6.4.

For diagnostic purposes, the control apparatus 2 to 4 are connected by way of defect or trouble lamp line 7 for the emission of flashing codes and by way of a diagnostic bus 8 for the initialization (initialization line L) of the diagnostic analysis, and for the data traffic (communication line K) between the control apparatus 2 to 4 themselves and/or between the control apparatus and a connectable computer-controlled workshop testing apparatus 9 or a diagnostic computer integrated in the vehicle, for example, according to DE-OS 35 40 559 corresponding to U.S. Pat. No. 4,748,843. The construction of the control apparatus is also described more fully in this DE-OS 35 40 559 as that a detailed explanation thereof is dispersed with herein.

A simple diagnostic possibility now consists in a key or momentary switch 10, by means of which the initialization line L can be connected to vehicle ground M by way of a signal application of defined duration in order to initiate the diagnostic function, respectively, to erase trouble or defect memories, as is already described in the discussed state of the art. As a result of the ground connection, the control apparatus recognize that it involves a diagnostic analysis with output of flashing codes and not a diagnostic analysis with a workshop testing apparatus or a testing apparatus integrated in the vehicle. The flashing codes are outputted by the control apparatus by way of the trouble or defect lamp line 7 and a trouble or defect lamp 11 connected to the positive battery voltage Ub. For that purpose, the control apparatus 2 to 4 include so-called "active-pull-down" outputs 12.2 to 12.4 which connect the trouble or defect lamp 11 to ground for purposes of signal application or outputting to the lamp 11.

Finally, a simple testing apparatus is designated by reference numeral 13 which will be described more fully hereinafter. It assumes in a simple manner the function of the momentary switch 10 (signal application of defined duration, initialization time) and of the error lamp 11 and indicates the error code directly as numbers so that the counting of the flashing pulses of the flashing code can be dispensed with.

Figure 2:
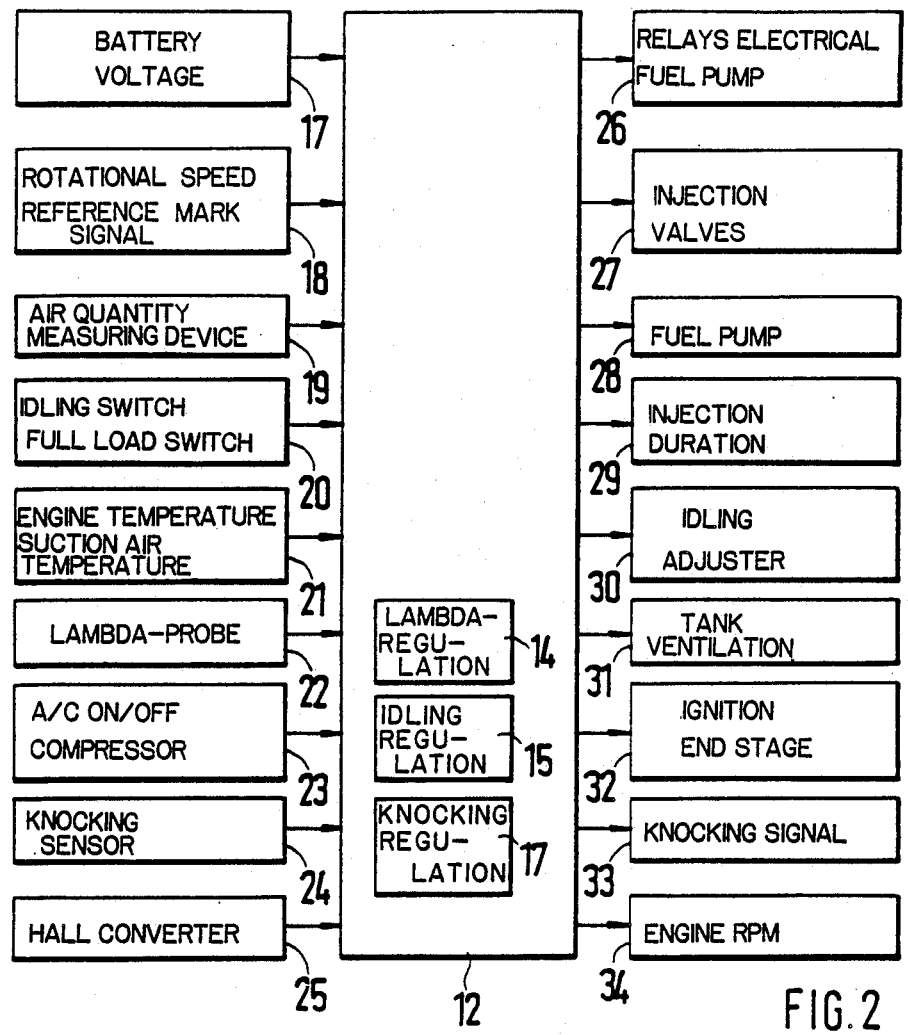
FIG. 2 is a control apparatus in accordance with the present invention with all functions, sensors, adjusting members and switching inputs capable of diagnostic analysis.

In FIG. 2, the diagnostic extent of a control apparatus excluding the interconnection of FIG. 1, is indicated by reference to an engine control apparatus 12. A lambda-, 14, an idling-, 15 and a knocking-regulation 16 can be internally diagnostically analyzed. Provided at input are: battery voltage 17, rotational speed and reference mark signal 18, air quantity measurement device 19, idling and full load switch 20, temperature of the engine and of the suction air 21, lambda-probe 22, air-conditioning installation on-off switch and air-conditioning installation compressor 23, knocking sensor 24, and Hall generator 25. The outputs include: relays of electrical fuel pump 26, injection valves 27, fuel pump 28, injection duration 29, idling adjuster 30, tank-venting valve 31, ignition end stage 32, knocking signal 33 and rotational speed 34.

A flashing code word is shown in FIG. 3. The time t is plotted along the abscissa and H designates along the ordinate an illuminated trouble or defect lamp which is extinguished at zero. The flashing code word commences with a start flashing pulse S and a pause P, in each case of double-pulse width. Subsequently, the four flashing sequences or digits B1 to B4 are transmitted again separated by pauses P of double-pulse width.

The indicated pulse diagram represents the code word "2 1 4 2"; a trouble or defect of a just-selected control apparatus can be coordinated thereto by way of a table. Customarily, the code word thereby contains no indication as regards the defective control apparatus and the type of defect.

According to the present invention, a certain specific information content is now assigned to the individual flashing sequences or digits B1 to B4 of the flashing code word.

The first flashing sequence B1, provides a control apparatus-identification, i.e., indicates the control apparatus just diagnostically analyzed (in this case, for example, "2" corresponds to ignition control apparatus). Up to nine different control apparatus can be diagnostically analyzed:

One flashing pulse=Motronic or LH-Jetronic,
Two flashing pulses=ignition control, etc.

The second flashing sequence B2 indicates a mode of the diagnostic analysis:
One flashing pulse=permanent defect or trouble,
Two flashing pulses=intermittently occurring defect or trouble,
Three flashing pulses=adjusting member and switching input testing,
Four flashing pulses=base air requirement adaptation,
Five flashing pulses=no defect or trouble,
Zero flashing pulses=end of the defect output.

A differentiation of maximum nine different modi are possible.

The third and fourth flashing sequences, B3 and B4 designate a defect code. Up to 99 code words can be differentiated. In conjunction with zero or five flashing pulses in the second flashing sequence, B2, no flashing pulses are outputted in the third and fourth flashing sequence B3 and B4 (no defect, end of the defect output).

In FIG. 4, three different signal outputs of defined time duration onto the initialization line (hereinafter initialization pulses) are indicated in FIG. 4 in a time diagram, by means of which the different diagnostic functions can be initiated. A short initialization pulse R1 with a time duration of 2.5 seconds to 5 seconds serves for the initiation of the defect (trouble) output and for the continuing switching to the next, of a respective control apparatus. A middle length initialization pulse R2 of five second to ten second duration, newly introduced according to the present invention serves for the discontinuation of the diagnostic analysis of the control apparatus which is just being diagnostically analyzed. A longer length initialization pulse R3 with a duration in excess of ten seconds initiates a cancellation or erasing of the defect memory with a previously indicated end of the defect output and further diagnostic functions.

Figure 5:
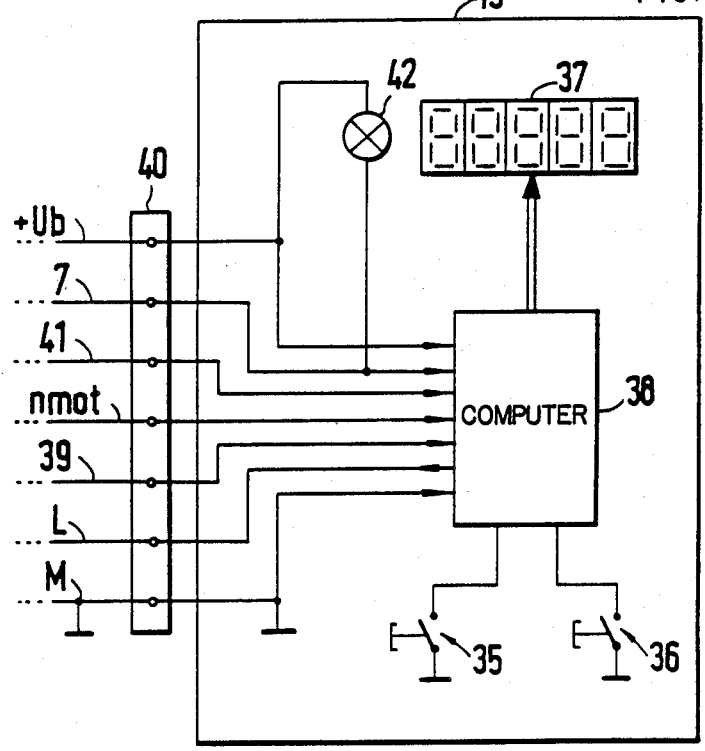
FIG. 5 is a schematic diagram of an external testing apparatus as used with the present invention.

An external testing apparatus 10 of simple construction (corresponding to FIG. 1, reference numeral 13) is illustrated in FIG. 5. It includes a function key or momentary switch 35, an initialization key or momentary switch 36 and an indicator 37. The duration of the initialization pulses R1 to R3 can be preselected by means of the function momentary switch 35; the preselected initialization duration is indicated on the indicator 37 and is initiated by means of the initialization momentary switch 36.

A built-in microcomputer 38 examines the signals on the defect lamp line 7, recognizes the starting pulse and the following pause as the beginning of the flashing code word and counts the following flashing pulses of the four flashing sequences or digits separated by pauses and indicates the respective counter result in one position or digit each of the indicator 37.

As a result thereof, the onerous counting of the flashing sequences and the input of the initialization pulse by manual actuation of the momentary switch on using a stop watch to select duration can be dispensed with. Not only is the input and output comfort improved but, in particular, in conjunction with the improved information structure of the flashing code word, the safety is improved in the recognition of a defect or trouble.

The testing apparatus 13 further includes a function for counting knocking pulses which can be initiated by simultaneously depressing both the function momentary switch 35 and also the initialization momentary switch 36. An ignition pulse counter counts the ignition pulses which are made available to the same from the ignition apparatus or the engine control by way of a line nmot, whereas a knocking counter counts and indicates the knocking results of the internal combustion engine signalled by way of the line 39 from the same apparatus. Upon reaching a predetermined number of ignition pulses, for example, 10,000, the knocking counting is stopped and a relative value of knocking pulses per 1,000 ignition pulses is indicated on the indicator 37.

The testing apparatus 13 is connected by way of a connection 40 disconnectably arranged in the motor vehicle with the battery voltage Ub, the defect or trouble lamp lines 7, an ignition current line 41 (ignition on), the line nmot, the line 39 (knocking events), the initialization line L and the vehicle ground. The ignition pulse and knocking counters can be constructed in a known manner as software or as a hardware counters, whereby the latter can also be integrated into the microcomputer 38. The activation of the initialization pulses and the counting of the flashing code word also takes place by means of the microcomputer 38. A defect (trouble) lamp 42 integrated in the testing apparatus 13 finally serves for the visual control of the flashing pulses.

The indicator 37 is preferably constructed as five-digit seven-segment indicator, whereby four digits serve for the indication of the code word and one place serves for the function indication (selected initialization pulse R1 to R3, knocking counting, etc.).

While I have shown and described only one embodiment in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

I claim:

1. A diagnostic system for a plurality of control devices having decreasing priority of a motor vehicle, each equipped with a defect memory means and at least one self-diagnostic function means comprising:
   a defect lamp;
   defect lamp line means connecting said control apparatus to each other and to said defect lamp;
   data but means including initialization line means connecting said control devices;
   each control device being responsive to a first distinctive signal on said initialization line means to read-out diagnostic data as a flashing code word on said defect lamp line means to flash said defect lamp, said flashing code word including a start flashing pulse followed by four flashing sequences of up to nine flashing pulses each separated by pauses, each of the four flashing sequences in their timed sequence representing distinctive data;
   each control device being addressed sequentially in decreasing priority to read-out said diagnostic data of respective control device in a diagnostic sequence with decreasing priority, and being responsive to a second distinctive signal on said initialization line means to discontinue said read-out from a respective control apparatus and begin read-out from a lower priority control device.

2. A diagnostic system according to claim 1, wherein the first flashing sequence of the flashing code word designates a control device identification, the second flashing sequence a mode, and the third and the fourth flashing sequence a defect code.

3. A diagnostic system according to claim 2, wherein a differentiation is made between a type of defect occurring only temporarily and a defect occurring permanently.

4. A diagnostic system according to claim 3, wherein an external testing apparatus is operable to be connected to the initialization line means and the defect lamp line means, said external testing apparatus includes a function switch means, an initialization switch means and an indicating means, the duration of the signal applied to the initialization line means being predetermined by the function switch means and the signal applications being initiated by the initialization switch means, the number of flashing pules of the four flashing sequences is detected by at least one counter means and is displayed as a code word on the indicating means.

5. A diagnostic system according to claim 4, wherein the testing apparatus further comprises an additional function means which serves for counting knocking pulses of an internal combustion engine of the motor vehicle, the testing apparatus including a knocking counter means and an ignition pulse counter means, the knocking counter means counting the knocking events recognized during a predetermined number of ignition pulses and indicating the same on the indicating means, and a relative value of the counted knocking events, in relation to the number of ignition pulses being indicated on the indicating means upon reaching a predetermined number of ignition pulses.

6. A diagnostic system according to claim 5, wherein the testing apparatus further includes a light diode which directly indicates the flashing pulses.

7. A diagnostic system according to claim 6, wherein the indicating means of the testing apparatus includes a function indication means which indicates the duration of the selected signal application, respectively, a status of the additional function.

8. A diagnostic system according to claim 7, wherein the testing apparatus is connected by way of two further line means with an ignition control device of the internal combustion engine by way of which it obtains signals as regards the knocking pulses and the rotational speed of the internal combustion engine.

9. A diagnostic system according to claim 1, wherein an external testing apparatus is operable to be connected to the initialization line means and the defect lamp line means, said external testing apparatus includes a function switch means, an initialization switch means and an indicating means, the duration of the signal applied to the initialization line means being predetermined by the function switch means and the signal applications being initiated by the initialization switch means, the number of flashing pules of the four flashing sequences is detected by at least one counter means and is displayed as a code word on the indicating means.

10. A diagnostic system according to claim 9, wherein the testing apparatus further comprises an additional function means which serves for counting knocking pulses of an internal combustion engine of the motor vehicle, the testing apparatus including a knocking counter means and an ignition pulse counter means, the knocking counter means counting the knocking events recognized during a predetermined number of ignition pulses and indicating the same on the indicating means, and a relative value of the counted knocking events, in relation to the number of ignition pulses being indicated on the indicating means upon reaching a predetermined number of ignition pulses.

11. A diagnostic system according to claim 9, wherein the testing apparatus further includes a light diode which directly indicates the flashing pulses.

12. A diagnostic system according to claim 9, wherein the indicating means of the testing apparatus includes a function indication means which indicates the duration of the selected signal application, respectively, a status of the additional function.

13. A diagnostic system according to claim 9, wherein the testing apparatus is connected by way of two further line means with an ignition control device of the internal combustion engine by way of which it obtains signals as regards the knocking pulses and the rotational speed of the internal combustion engine.

14. A diagnostic system according to claim 9, wherein the first flashing sequence of the flashing code word designates a control device identification, the second flashing sequence a mode, and the third and the fourth flashing sequence a defect code.

15. A diagnostic system according to claim 1 wherein the control devices are responsive to a third distinctive signal on said initialization line to erase said defect memory means after a read-out.

16. A diagnostic system according to claim 1 wherein said first and second distinctive signals are single pulses of distinctive duration.

* * * * *